(12) United States Patent
Kang et al.

(10) Patent No.: US 12,276,945 B1
(45) Date of Patent: Apr. 15, 2025

(54) METHOD FOR COMPENSATING FOR FREQUENCY SHIFTS CAUSED BY VARIATIONS IN ENVIRONMENTAL PARAMETER OF ATOMIC CLOCK

(71) Applicant: Innovation Academy for Precision Measurement Science and Technology, CAS, Wuhan (CN)

(72) Inventors: Songbai Kang, Wuhan (CN); Linzhen Zhao, Wuhan (CN); Dou Li, Wuhan (CN); Kangqi Liu, Wuhan (CN)

(73) Assignee: INNOVATION ACADEMY FOR PRECISION MEASUREMENT SCIENCE AND TECHNOLOGY, CAS, Wuhan (CN)

( * ) Notice: Subject to any disclaimer, the term of this patent is extended or adjusted under 35 U.S.C. 154(b) by 0 days.

(21) Appl. No.: 18/991,779

(22) Filed: Dec. 23, 2024

(30) Foreign Application Priority Data

Mar. 20, 2024 (CN) .......................... 202410321795.X

(51) Int. Cl.
  *G04F 5/14* (2006.01)
  *H01S 3/00* (2006.01)
  *H03L 7/26* (2006.01)

(52) U.S. Cl.
  CPC .............. *G04F 5/14* (2013.01); *H01S 3/0085* (2013.01); *H03L 7/26* (2013.01)

(58) Field of Classification Search
  CPC ........................................................ G04F 5/14
  USPC ........................................................ 331/94.1
  See application file for complete search history.

(56) References Cited

U.S. PATENT DOCUMENTS

| | | | | |
|---|---|---|---|---|
| 5,777,773 | A * | 7/1998 | Epworth | H04B 10/504 372/32 |
| 10,684,591 | B1 * | 6/2020 | Burke | H01S 3/1303 |
| 2009/0022189 | A1 * | 1/2009 | Okuno | G02F 1/3513 372/25 |
| 2010/0156547 | A1 * | 6/2010 | McGuyer | G04F 5/145 331/94.1 |
| 2013/0335154 | A1 * | 12/2013 | Marmet | H03L 7/26 331/94.1 |
| 2016/0116678 | A1 * | 4/2016 | Evans | H01S 5/0687 385/11 |
| 2017/0207596 | A1 * | 7/2017 | Zhang | H04B 10/541 |
| 2024/0243543 | A1 * | 7/2024 | Berthoud | H03L 7/26 |

* cited by examiner

*Primary Examiner* — Joseph Chang
(74) *Attorney, Agent, or Firm* — Bayramoglu Law Offices LLC

(57) ABSTRACT

A method for compensating for frequency shifts caused by variation in an environmental parameter of an atomic clock is provided. A preset reference voltage of a proportional integral differential amplifier is set so that an offset frequency shift is generated in locking frequency of a laser. Then, the preset reference voltage is optimized by correcting the frequency shift coefficient to obtain an optimal reference voltage. A non-peak point of the resonance spectral line of the atomic clock is locked, so that the variation in the offset frequency shift caused by power variation of an optical signal output by the laser can compensate for the variation in the locking frequency of the laser caused by the power variation, thereby reducing the frequency shift coefficient caused by the power variation. The method is simple to operate and has universality.

4 Claims, 2 Drawing Sheets

METHOD FOR COMPENSATING FOR FREQUENCY SHIFTS CAUSED BY VARIATIONS IN ENVIRONMENTAL PARAMETER OF ATOMIC CLOCK

CROSS REFERENCE TO THE RELATED APPLICATIONS

This application is based upon and claims priority to Chinese Patent Application No. 202410321795.X, filed on Mar. 20, 2024, the entire contents of which are incorporated herein by reference.

TECHNICAL FIELD

The present disclosure belongs to the technical field of atomic clocks, and specifically relates to a method for compensating for a frequency shift caused by a change in an environmental parameter of an atomic clock, which is applicable to compensation for frequency shifts caused by different changes in the environmental parameter.

BACKGROUND

The medium and long-term frequency stability is one of core indicators for an atomic clock, which is usually limited by frequency shifts caused by environmental effects, such as probe signal power, temperature, magnetic field, and air pressure. Accordingly, reducing frequency shift coefficients of environmental parameters helps to improve the medium and long-term stability of the atomic clock.

Existing methods for suppressing a frequency shift of an atomic clock include minimizing environmental variations that cause the frequency shift of the atomic clock (e.g., improving the stability of system temperature control, actively stabilizing optical power, and increasing magnetic shielding), reducing a frequency shift coefficient (e.g., by using a mixed buffer gas solution for a rubidium atomic clock), and compensating for the frequency shift caused by an environmental effect with an additional frequency shift caused by the asymmetry of a resonance signal of the atomic clock (e.g., by using different polarizations of two-color resonant light). However, the above three existing methods for suppressing the frequency shift caused by the environmental parameters cannot be universally applied to other atomic clock technologies or other physical effects.

In the prior art, the technical means of compensation used to suppress a frequency shift caused by a change in the same environmental parameter are different on different atomic clock platforms; and on the same atomic clock platform, the technical means of compensation are also different for different environmental parameters, so that there is no universality.

SUMMARY

In view of the above problems in the prior art, an objective of the present disclosure is to provide a method for compensating for frequency shifts caused by variations in environmental parameter of an atomic clock.

The above objective of the present disclosure is achieved by the following technical means:

A method for compensating for frequency shifts caused by variations in an environmental parameter of an atomic clock includes the following steps:

step 1: measuring the frequency shift coefficient $\alpha$ caused by power variation of an optical signal output by a laser;

step 2: setting the power of the optical signal output by the laser to $A_i$, and acquiring an error signal slope $k_i$ of an error signal generated by a lock-in amplifier when the power of the optical signal output by the laser is $A_i$;

step 3: changing the power $A_i$ of the optical signal output by the laser and repeating the step 2 until multiple sets of power and corresponding error signal slopes $(A_i, k_i)$ are acquired, where i is a power sequence number; and then, performing fitting to obtain a relationship coefficient $\beta$ between the error signal slope $k_i$ and the power $A_i$ of the optical signal output by the laser; and step 4: calculating a preset reference voltage $V_{offset}$ of a proportional integral differential amplifier by the following formula:

$$V_{offset} = \alpha\beta \frac{A_0^{n+1}}{n},$$

where n is an exponential parameter, and $A_0$ is the power of the optical signal output by the laser that is set during actual working.

A method for compensating for frequency shifts caused by variations in an environmental parameter of an atomic clock further includes the following steps:

step 5: setting a reference voltage of the proportional integral differential amplifier to the preset reference voltage $V_{offset}$, and testing a corrected frequency shift coefficient $\alpha'$ caused by power variation of the optical signal output by the laser, where the corrected frequency shift coefficient $\alpha'$ is calculated based on the following formula: $\alpha' = \delta f_L/\delta A$, where $\Delta f_L$ is a maximum variation in a locked frequency of the laser within a fluctuation range of the power of the optical signal outputted by the laser after the preset reference voltage $V_{offset}$ is set, and $\delta A$ is the power variation; and step 6: optimizing the preset reference voltage $V_{offset}$, i.e., changing the reference voltage of the proportional integral differential amplifier within the preset fluctuation range, and until the minimum corrected frequency shift coefficient $\alpha'$ caused by power variation of the optical signal output by the laser is tested and the reference voltage of the proportional integral differential amplifier corresponding to the minimum corrected frequency shift coefficient $\alpha'$ is the optimal reference voltage, ending suppression of the frequency shift coefficient caused by variations in the power of the optical signal output by the laser.

The frequency shift coefficient $\alpha$ as described above is measured based on the following steps: setting the reference voltage of the proportional integral differential amplifier to 0 V by a voltage set point of the proportional integral differential amplifier, locking the frequency of the laser, changing power A of the optical signal outputted by the laser, measuring the locked frequency f of the laser, acquiring multiple sets of power of the optical signal output by the lasers and the corresponding locked frequency of the laser, and then performing a linear fit by linear function $f=\alpha A$ to obtain the frequency shift coefficient $\alpha$ caused by power variation of the optical signal output by the laser.

The step 2 as described above specifically includes the following steps:

step 2.1: performing frequency modulation on the laser by an alternating sinusoidal voltage signal generated by the lock-in amplifier, inputting the optical signal output by the laser to an atomic vapor cell, outputting a fluorescence signal by the atomic vapor cell to a photomultiplier tube, outputting an alternating current voltage signal with frequency modulation information by the photomultiplier tube to the lock-in amplifier, performing homodyne demodulation on the input alternating current voltage signal with the modulation information by the lock-in amplifier to obtain the error signal, and inputting the error signal to an oscilloscope to obtain an error signal curve; and step 2.2: converting a voltage V-time t relationship of the error signal curve into a voltage V-frequency f relationship by using a time and frequency relationship of the error signal curve that is acquired by atomic signal calibration, and then performing a linear fit on the linear area of the converted direct current error signal curve by linear function formula $V=k_i f+b$ to acquire the error signal slope $k_i$, where b is an intersection point between a straight line formed by fitting the linear area of the error signal curve and the vertical axis, namely, voltage V.

In step 3 as described above, the relationship coefficient $\beta$ between the error signal slope $k_i$ and the power $A_i$ of the optical signal output by the laser is obtained by the following formula: $k_i=\beta A_i^n (n \neq 0)$.

In step 6 as described above, the preset fluctuation range is $\pm 2V_{offset}$.

Compared with the prior art, the present disclosure has the following beneficial effects:

In the method according to the present disclosure, the reference voltage of the proportional integral differential amplifier is setted so that an offset frequency shift is introduced in the laser's locking frequency. Then, a non-peak frequency point (i.e., the reference voltage of the proportional integral differential amplifier is not 0 V) of a resonance spectral line of the atomic clock is locked, so that the variation in the offset frequency shift caused by power variation of the optical signal output by the laser can compensate for the variation in the laser's locking frequency caused by power variation of the optical signal output by the laser, thereby reducing the frequency shift coefficient caused by power variation of the optical signal output by the laser. The method according to the present disclosure is simple to operate and has universality.

DETAILED DESCRIPTION OF THE EMBODIMENTS

To facilitate the understanding and implementation of the present disclosure by those skilled in the art, the present disclosure is further described in detail below in conjunction with embodiments. The embodiments described herein are only used to illustrate and explain the present disclosure and not to limit the present disclosure.

EMBODIMENT

A method for compensating for frequency shifts caused by variations in an environmental parameter of an atomic clock includes the following steps:

In step 1, the reference voltage of the proportional integral differential amplifier is set to 0 V by the voltage set point of the proportional integral differential amplifier (e.g., for a proportional integral differential amplifier SIM960, an indicator light is adjusted to setpoint by a select button on a front panel, and then the reference voltage of the proportional integral differential amplifier SIM960 is set to 0 V by adjusting up and down buttons), the frequency of the laser is locked, power A of an optical signal output by the laser is changed, the locking frequency f of the laser is measured, five sets of power of optical signals output by lasers and the corresponding locking frequency of the laser are acquired, and then a linear fit is performed by a linear function $f=\alpha A$ to obtain the frequency shift coefficient $\alpha$ caused by power variation of the optical signal output by the laser.

The environmental parameter in this embodiment is the power of the optical signal output by the laser.

Figure 3:
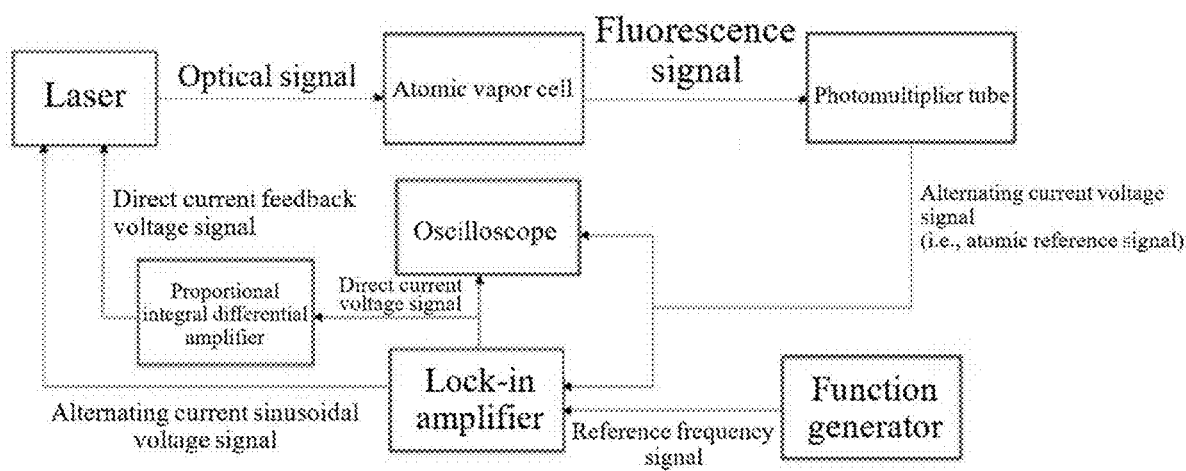
FIG. 3 is the principle block diagram of frequency locking for a laser in an embodiment of the present disclosure.

As shown in FIG. 3, the process for locking the frequency of the laser is specifically as follows: a reference frequency signal output by a function generator is input into a lock-in amplifier (i.e., the reference frequency signal output by the function generator is used as a frequency reference for a modulation signal output by the lock-in amplifier), the lock-in amplifier outputs an alternating current sinusoidal voltage signal (i.e., the modulation signal) to modulate the frequency of the optical signal output by the laser, the laser outputs the optical signal to an atomic vapor cell, the atomic vapor cell outputs a fluorescence signal to a photomultiplier tube, the photomultiplier tube converts the input fluorescence signal into an alternating current voltage signal with modulation information, the alternating current voltage signal enters an oscilloscope and the lock-in amplifier separately, the oscilloscope displays the alternating current voltage signal curve, the lock-in amplifier performs homodyne demodulation on the input alternating current voltage signal with the modulation information to obtain a direct current voltage signal, namely, an error signal, the error signal enters the oscilloscope and the proportional integral differential amplifier separately, the oscilloscope displays an error signal curve, the proportional integral differential amplifier outputs a direct current feedback voltage signal based on the error signal to the laser, and when the amplitude of the error signal displayed on the oscilloscope is 0, frequency locking is completed, and the frequency of the laser is the locking frequency.

In step 2, the power of the optical signal output by the laser is set to $A_i$, and an error signal slope $k_i$ of the error signal generated by the lock-in amplifier when the power of the optical signal output by the laser is $A_i$ is acquired, which specifically includes the following steps:

step 2.1: performing frequency modulation on the laser by an alternating sinusoidal voltage signal generated by the lock-in amplifier, inputting the optical signal output by the laser to the atomic vapor cell, outputting the fluorescence signal by the atomic vapor cell to the photomultiplier tube, outputting an alternating voltage signal with frequency modulation information by the photomultiplier tube to the lock-in amplifier, performing homodyne demodulation on the input alternating voltage signal with the modulation information by the lock-in amplifier to obtain a direct voltage signal, namely, the error signal, and inputting the error signal to an oscilloscope to obtain an error signal curve with a horizontal axis as time and a vertical axis as voltage; and step 2.2: converting a voltage V (vertical axis)–time t (horizontal axis) relationship of the error signal curve into a voltage V (vertical axis)–frequency f (horizontal axis) relationship by using a time and frequency relationship of the error signal curve that is acquired by atomic signal calibration, and then performing a linear fit on the linear area of the converted error signal curve by linear function formula $V=k_i f+b$ to acquire the error signal slope $k_i$, where b is the intersection point between the straight line formed by fitting the linear area of the error signal curve and the vertical axis, namely, voltage V.

In step 3, power $A_i$ of the optical signal output by the laser is changed and the step 2 is repeated until five sets of power of optical signals output by the laser and the corresponding error signal slopes $(A_i, k_i)$ are acquired, where i is the power sequence number, and i=1~5; and then, fitting is performed by the following formula to obtain the relationship coefficient β between the error signal slope $k_i$ and the power $A_i$ of the optical signal output by the laser:

$$k_i = \beta A_i^n \quad (n \neq 0) \qquad \text{formula (1)}$$

where n is an exponential parameter. In this embodiment, n is 2.

In step 4, a preset reference voltage $V_{offset}$ of a proportional integral differential amplifier is calculated by the following formula based on the frequency shift coefficient α measured in the step 1 and the relationship coefficient β between the error signal slope $k_i$ and the power $A_i$ of the optical signal output by the laser that is obtained by fitting in the step 3:

$$V_{offset} = \alpha \beta \frac{A_0^{n+1}}{n} \qquad \text{formula (2)}$$

where $A_0$ is the power of the optical signal output by the laser that is set during actual working.

A calculation formula for the preset reference voltage $V_{offset}$ is derived by the following process.

Figure 1:
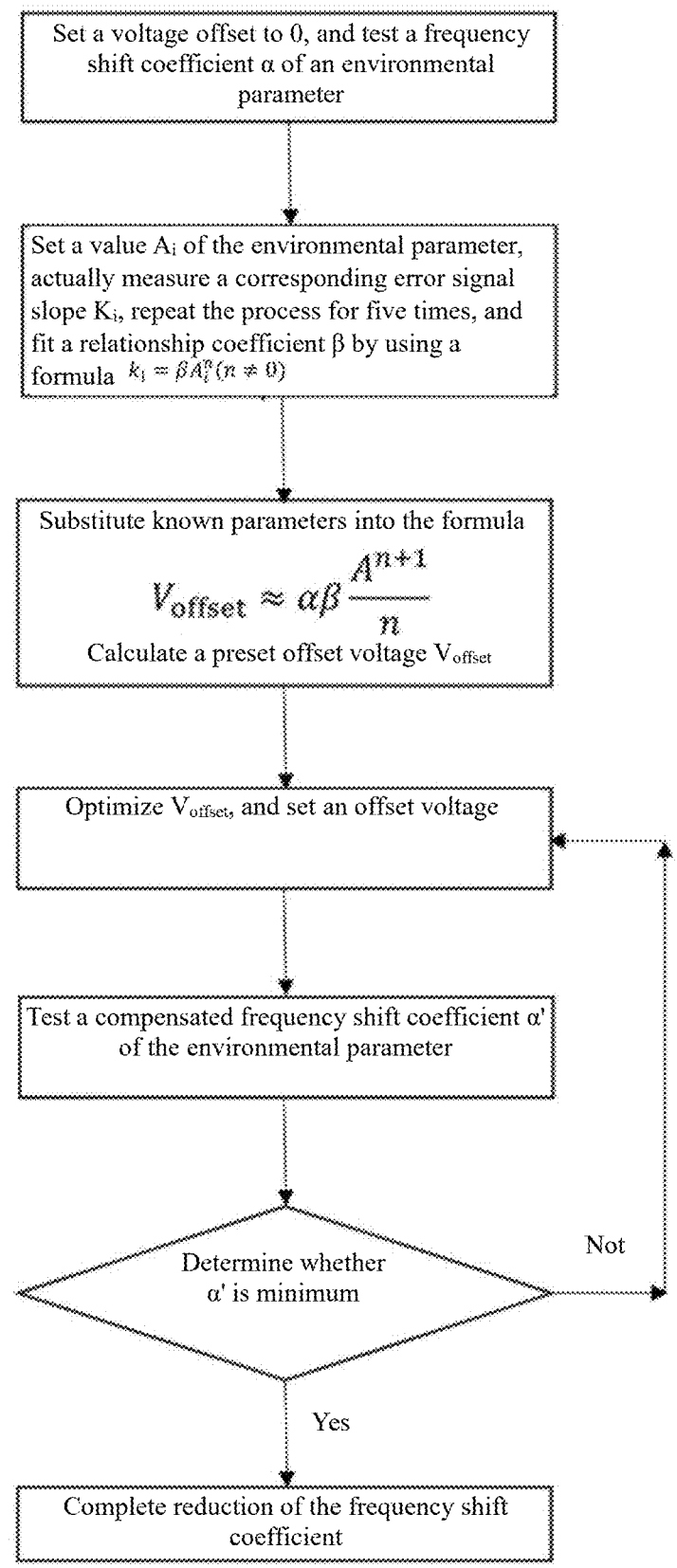
FIG. 1 is the flowchart of the present disclosure.
Figure 2:
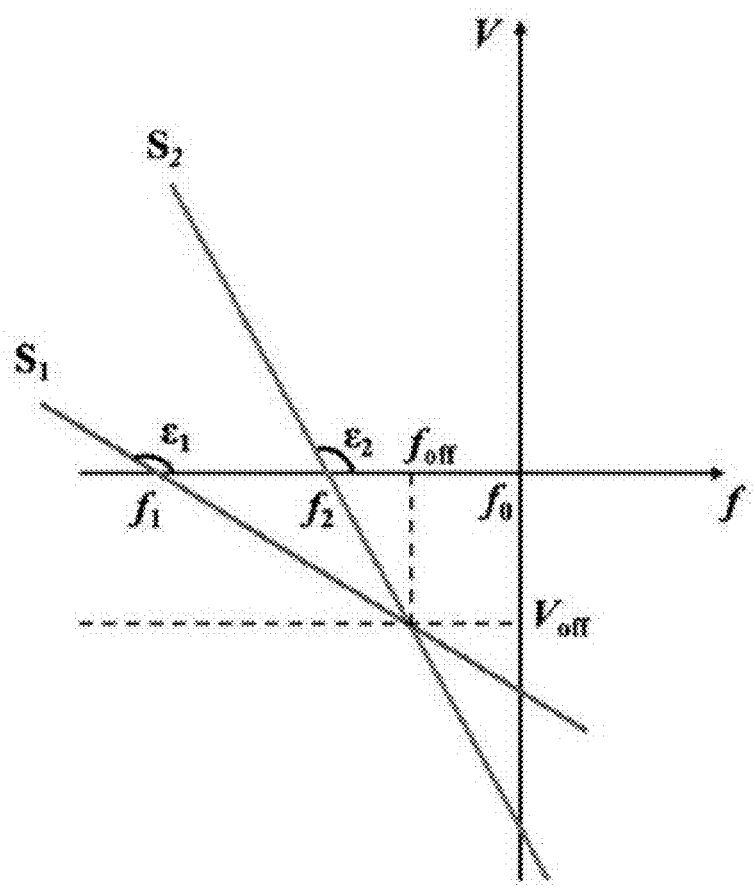
FIG. 2 is the principle diagram of the present disclosure (where $f_0$ is the locked output frequency when power of an optical signal output by a laser is set during actual working, f is the locking frequency of the laser, V is the voltage amplitude of an error signal, $S_1$ is the linear area of an error signal curve when the power of the optical signal output by the laser is $A_1$, $S_2$ is the linear area of the error signal curve when the power of the optical signal output by the laser is $A_2$, $\varepsilon_1$ is the angle between $S_1$ and a horizontal axis, and $\varepsilon_2$ is the angle between $S_2$ and the horizontal axis)

As shown in FIG. 2, when it is assumed that the power of the optical signal output by the laser changes from $A_1$ to $A_2$, that is, a variation δA in the power of the optical signal output by the laser is equal to $A_2-A_1$, as the power variation of the optical signal output by the laser will change the locking frequency of the laser, the locking frequency of the laser changes from $f_1$ to $f_2$, that is, $$f_2 - f_1 = \alpha(A_2 - A_1) \qquad \text{formula (3)}$$

where $f_1$ is the locking frequency of the laser when the power of the optical signal output by the laser is $A_1$, and $f_2$ is the locking frequency of the laser when the power of the optical signal output by the laser is $A_2$.

To compensate for frequency shift $f_1-f_2$ caused by a change in the power of the optical signal output by the laser from $A_1$ to $A_2$, the preset reference voltage $V_{offset}$ is setted. An offset frequency shift δfe caused by the locking frequency of the laser under the preset reference voltage $V_{offset}$ is as follows:

$$\delta f_e = f_{offset} - f_i = V_{offset}/\tan \varepsilon_i = V_{offset}/k_i \qquad \text{formula (4)}$$

where the error signal slope $k_i$ is less than 0 by default, $f_i$ is the locking frequency of the laser when the power of the optical signal output by the laser is $A_i$ (when the reference voltage of the proportional integral differential amplifier is 0 V), $f_{offset}$ is the locking frequency of the laser after the preset reference voltage $V_{offset}$ was setted when the power of the optical signal output by the laser is $A_i$, $\varepsilon_i$ is the angle between $S_i$ and the horizontal axis (frequency f), $S_i$ is the linear area of the error signal curve (voltage V (vertical axis)–frequency f (horizontal axis)) when the power of the optical signal output by the laser is $A_i$.

When the power of the optical signal output by the laser changes, the offset frequency shift δfe also changes accordingly, so that a variation in the locking frequency of the laser caused by the variation in the power of the optical signal output by the laser is equal and opposite in direction to a variation in the offset frequency shift δfe of the locking frequency of the laser caused by setting the preset reference voltage $V_{offset}$ when the power of the optical signal output by the laser changes. This can achieve the purpose of compensation.

When the power of the optical signal output by the laser variates, the variation $\Delta f_e$ in the offset frequency shift $\delta f_e$ caused by the reference voltage is as follows:

$$\Delta f_e = V_{offset}/k_2 - V_{offset}/k_1 \qquad \text{formula (5)}$$

The variation of the introduced offset frequency shift $\delta f_e$ can compensate for the variation in the locking frequency caused by the variation in the power of the optical signal output by the laser, that is, $$\Delta f_e + \alpha \delta A = 0 \qquad \text{formula (6)}$$

The formulas (1), (3), and (5) are substituted into the formula (6) to obtain $$\frac{V_{offset}}{\beta A_2^n} - \frac{V_{offset}}{\beta A_1^n} = -\alpha(A_2 - A_1) \qquad \text{formula (7)}$$

The formula (7) is further simplified to obtain $$\frac{-(A_2 - A_1)\left(A_2^{n-1} + A_2^{n-2}A_1 + \ldots + A_1^{n-1}\right)}{(A_1 A_2)^n} \cdot \frac{V_{offset}}{\beta} = -\alpha(A_2 - A_1) \qquad \text{formula (8)}$$

An expression for the preset reference voltage $V_{offset}$ obtained by the formula (8) is as follows:

$$V_{offset} = \alpha \beta \frac{(A_1 A_2)^n}{A_3^{n-1} + A_3^{n-2}A_1 + \ldots + A_1^{n-1}} \qquad \text{formula (9)}$$

The fluctuation range of the power of the optical signal output by the laser is much smaller than power $A_0$ of the optical signal output by the laser that is set during actual working, that is, when $\delta A \ll A_0$, $A_2 \approx A_0$, and $A_1 \approx A_0$. A calculation formula for the preset reference voltage $V_{offset}$ obtained by simplifying the formula (9) is as follows:

$$V_{offset} \approx \alpha \beta \frac{A_0^{n+1}}{n} (n \neq 0) \qquad \text{formula (10)}$$

In step 5, the reference voltage of the proportional integral differential amplifier is set to the preset reference voltage $V_{offset}$ calculated in the step 4, and the corrected frequency shift coefficient α' caused by the power variation of the optical signal output by the laser at this time is tested.

After application of offset locking (i.e., setting the reference voltage of the proportional integral differential amplifier to the preset reference voltage $V_{offset}$), a relationship between the power of the optical signal output by the laser and the frequency shift caused by the power of the optical signal output by the corresponding laser may no longer be linear. To unify evaluation systems, the frequency shift coefficient is still used for representation, but the frequency shift coefficient α is changed to the corrected frequency shift coefficient α'. The corrected frequency shift coefficient α' is calculated based on the following formula:

$$\alpha' = \delta f_L / \delta A \qquad \text{formula (11)}$$

where $\delta f_L$ is the maximum variation in locking frequency of the laser within a fluctuation range of the power of the optical signal output by the laser after the preset reference voltage $V_{offset}$ is set.

In step 6, the preset reference voltage $V_{offset}$ is optimized, that is, the reference voltage of the proportional integral differential amplifier is changed within $\pm 2V_{offset}$, and until the minimum corrected frequency shift coefficient α' caused by the change in the power of the optical signal output by the laser is tested and the reference voltage of the proportional integral differential amplifier corresponding to the minimum corrected frequency shift coefficient α' is an optimal reference voltage, suppression of the change in the frequency shift coefficient caused by the change in the power of the optical signal output by the laser ends.

It should be point out that the embodiments described in the present disclosure are merely illustrative of the spirit of the present disclosure. Those skilled in the art to which the present disclosure belongs may make various modifications or supplements to the embodiments described, or adopt similar methods to replace them, without departing from the spirit of the present disclosure or exceeding the scope defined by the appended claims.

What is claimed is:

1. A method for compensating for frequency shifts caused by a variation in an environmental parameter of an atomic clock, comprising the following steps:
   step 1: measuring a frequency shift coefficient α caused by a power variation of an optical signal output by a laser;
   step 2: setting power of the optical signal output by the laser to $A_i$, and acquiring an error signal slope $k_i$ of an error signal generated by a lock-in amplifier when the power of the optical signal output by the laser is $A_i$;
   step 3: changing the power $A_i$ of the optical signal output by the laser and repeating the step 2 until a first plurality of sets of the power of the optical signal output by laser and the corresponding error signal slopes ($A_i$, $k_i$) are acquired, wherein i is a power sequence number; and then, performing fitting to obtain a relationship coefficient β between the error signal slope $k_i$ and the power $A_i$ of the optical signal output by the laser;
   step 4: calculating a preset reference voltage $V_{offset}$ of a proportional integral differential amplifier by the following formula:

$$V_{offset} = \alpha\beta\frac{A_0^{n+1}}{n},$$

wherein n is an exponential parameter, and $A_0$ is power of the optical signal output by the laser set during actual working;
   step 5: setting a reference voltage of the proportional integral differential amplifier to the preset reference voltage $V_{offset}$, and testing a corrected frequency shift coefficient α' caused by the variation in the power of the optical signal output by the laser, wherein the corrected frequency shift coefficient α' is calculated based on the following formula:
   $\alpha' = \delta f_L / \delta A$, wherein $\delta f_L$ is a maximum variation in a locking frequency of the laser within a fluctuation range of the power of the optical signal output by the laser after the preset reference voltage $V_{offset}$ is set, and δA is a power variation; and
   step 6: optimizing the preset reference voltage $V_{offset}$, comprising changing the reference voltage of the proportional integral differential amplifier within a preset fluctuation range, and
until a minimum corrected frequency shift coefficient α' caused by the power variation of the optical signal output by the laser is tested and the reference voltage of the proportional integral differential amplifier corresponding to the minimum corrected frequency shift coefficient α' is an optimal reference voltage, ending suppression of the frequency shift coefficient α caused by the power variation of the optical signal output by the laser, wherein the frequency shift coefficient α is measured based on the following steps: setting the reference voltage of the proportional integral differential amplifier to 0 V by a voltage setting point of the proportional integral differential amplifier, locking a laser frequency, changing power A of the optical signal output by the laser, measuring the locking frequency f of the laser, acquiring a second plurality of sets of the power of the optical signal output by the laser and the corresponding locking frequencies of the laser, and then performing a first linear fit by a first linear function formula f=αA to obtain the frequency shift coefficient α caused by the power variation of the optical signal output by the laser.

2. The method for compensating for the frequency shifts caused by the variation in the environmental parameter of the atomic clock according to claim 1, wherein the step 2 comprises the following steps:
   step 2.1: performing a frequency modulation on the laser by an alternating sinusoidal voltage signal generated by the lock-in amplifier, inputting the optical signal output by the laser to an atomic vapor cell, outputting a fluorescence signal by the atomic vapor cell to a photomultiplier tube, outputting an alternating voltage signal with frequency modulation information by the photomultiplier tube to the lock-in amplifier, performing homodyne demodulation on the alternating voltage signal with the frequency modulation information by the lock-in amplifier to obtain the error signal, and inputting the error signal to an oscilloscope to obtain an error signal curve; and
   step 2.2: converting a voltage V-time t relationship of the error signal curve into a voltage V-frequency f relationship by using a time and frequency relationship of the error signal curve acquired by an atomic signal calibration, and then performing a second linear fit on a linear area of a converted direct current error signal curve by a second linear function formula $V=k_i f+b$ to acquire the error signal slope $k_i$, wherein b is an intersection point between a straight line formed by fitting a linear area of the error signal curve and a vertical axis, and the vertical axis represents voltage V.

3. The method for compensating for the frequency shifts caused by the variation in the environmental parameter of the atomic clock according to claim 2, wherein in the step 3, the relationship coefficient β between the error signal slope $k_i$ and the power $A_i$ of the optical signal output by the laser is obtained by the following formula: $k_i=\beta A_i^n$ ($n \neq 0$).

4. The method for compensating for the frequency shifts caused by the variation in the environmental parameter of the atomic clock according to claim 1, wherein in the step 6, the preset fluctuation range is $+2V_{offset}$.

* * * * *